United States Patent [19]

Kawai et al.

[11] E Re. 29,429

[45] Reissued Oct. 4, 1977

[54] OSCILLATOR FOR A TIMEPIECE

[75] Inventors: Masanori Kawai, Tatsuno; Haruo Takada, Suwa; Shinkichi Kobayashi, Chino, all of Japan

[73] Assignee: Kabushiki Kaisha Suwa Seikosha, Tokyo, Japan

[21] Appl. No.: 734,056

[22] Filed: Oct. 20, 1976

Related U.S. Patent Documents

Reissue of:

[64] Patent No.: 3,909,639
Issued: Sept. 30, 1975
Appl. No.: 460,231
Filed: Apr. 11, 1974

[30] Foreign Application Priority Data

June 14, 1973 Japan ..... 48-67132

[51] Int. Cl.[2] ..... H01L 41/04

[52] U.S. Cl. ..... 310/348; 310/370

[58] Field of Search ..... 310/8.2, 8.9, 9.1, 9.4, 310/9.6, 25; 331/116 R; 179/110 A; 58/23 R, 23 TF, 23 V

[56] References Cited

U.S. PATENT DOCUMENTS

| | | | |
|---|---|---|---|
| 2,666,196 | 1/1954 | Kinsley et al. | 310/9.6 X |
| 3,501,654 | 3/1970 | Humphries | 310/8.9 |
| 3,518,470 | 6/1970 | Lungo | 310/8.9 X |
| 3,697,766 | 10/1972 | Ganter et al. | 310/8.2 |
| 3,697,789 | 10/1972 | Kato et al. | 310/8.2 X |
| 3,710,040 | 1/1973 | Swinehart | 310/8.2 X |
| 3,795,831 | 3/1974 | Fujita | 310/8.2 X |

*Primary Examiner*—Mark O. Budd
*Attorney, Agent, or Firm*—Blum, Moscovitz, Friedman & Kaplan

[57] ABSTRACT

An improved, compact, impact-resistant quartz crystal oscillator is provided for a timepiece. The oscillator comprises a substantially flat hermetically sealed envelope, a terminal tag provided with a contact pin fixedly mounted in the envelope, and a support therefor comprising a substantially annular support member provided with an annular rib on the periphery thereof defined between opposed elbows therein. One of the elbows provides a groove seat registered with the periphery of an aperture provided in the oscillator envelope. The other elbow provides a groove seat for a bifurcated crystal mounting plate support having elastic characteristics. The mounting plate is resilient in the vibrating direction of the crystal and perpendicularly thereto. Mounted in the oscillator envelope in substantial alignment with weighted tine ends of the crystal is a pair of opposed dampers which enhance the impact-resistance characteristics of the oscillator. Also mounted in the oscillator envelope is a ground pin for preventing a short-circuit thereof.

12 Claims, 6 Drawing Figures

OSCILLATOR FOR A TIMEPIECE

Matter enclosed in heavy brackets [ ] appears in the original patent but forms no part of this reissue specification; matter printed in italics indicates the additions made by reissue.

BACKGROUND OF THE INVENTION

This invention relates to an improved quartz crystal oscillator for a timepiece, and more particularly, the instant invention relates to a bifurcated mounting plate for a tuning fork-type crystal vibrator employed therein.

In prior timepiece devices which employ oscillators including a quartz crystal vibrator, the vibrator element has been suspended on wire supports within a hermetically sealed oscillator envelope. The wire supports have been connected to the sealed oscillator terminal tag. This mounting is troublesome, costly, enlarges the overall size of the oscillator, and requires considerable assembly skill. Alternatively, the crystal vibrator has been mounted in parallel to the oscillator terminal tag on a finger extending upwardly therefrom within the oscillator envelope. However, it has been necessary to provide the crystal vibrator element with opposed notches for thereby making the vibrator tines independent of each other. The notches are difficult to make and weaken the crystal, thereby making it incapable of withstanding severe external shock.

There is, therefore, a need for a compact, impact-resistant oscillator and a vibrator mounting therefor which is inexpensive, easy to manufacture, capable of withstanding severe external shock, and which may be employed in a compact oscillator.

SUMMARY OF THE INVENTION

Generally speaking, in accordance with the invention, an improved, compact, impact-resistant quartz crystal oscillator is provided for a timepiece. The oscillator comprises a substantially flat hermetically sealed envelope, a terminal tag provided with a contact pin fixedly mounted in the envelope, and a support therefor comprising a substantially annular support member provided with an annular rib on the periphery thereof defined between opposed elbows therein. One of the elbows defines a groove with perpendicular abutment surfaces which abut a continuous edge of an aperture provided in the envelope for the oscillator terminal tag and contact pin mounted therein. The other elbow provided in the annular support defines a groove having perpendicular abutment surfaces for thereby supporting a bifurcated crystal mounting plate provided at one end with an annular aperture received on the annular support.

In particular, the novel bifurcated mounting plate is provided with a laterally extending substantially perpendicular flange engaged with a continuous edge of a tuning fork-type crystal seated thereon. Bifurcations in the mounting plate and tines of the crystal extend unidirectionally and respective bifurcations of the plate are in predetermined spaced relationship with respect to opposed tines of the crystal.

Ends of the respective tines of the crystal are weighted for a selected, predetermined crystal frequency. Mounted in the oscillator envelope in substantial alignment with the weighted tine ends of the crystal is a pair of opposed dampers which enhance the impact-resistance characteristics of the oscillator. Also mounted in the oscillator envelope is a ground pin for preventing a short-circuit thereof.

Accordingly, it is an object of this invention to provide an improved oscillator for a timepiece.

Another object of the invention is to provide a novel bifurcated mounting plate for a tuning fork-type crystal vibrator mounted in a timepiece oscillator.

A further object of the invention is to provide in a timepiece oscillator a mounted crystal vibrator which maintains an optimum Q value.

Still another object of the invention is to provide a mounting for the vibrator element within an oscillator which is capable of withstanding severe external shock.

Still other objects and advantages of the invention will, in part, be obvious and will, in part, be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
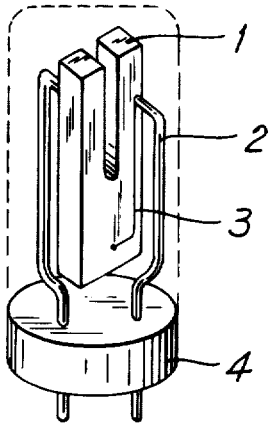
FIG. 1 PRIOR ART
FIGS. 1 and 2 are perspective views of prior art oscillators and conventional mountings for the vibrator element therein.
Figure 2:
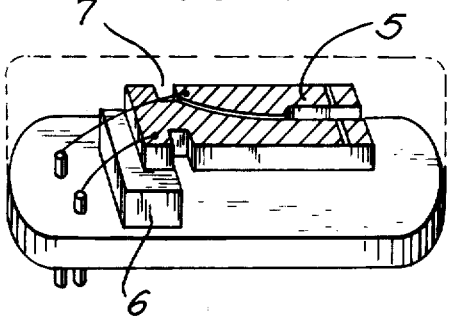
FIG. 2 PRIOR ART

FIGS. 1 and 2 show conventional mountings for tuning fork-type quartz crystal vibrators in conventional timepiece oscillators. In FIG. 1, a tuning fork-type crystal vibrator 1 is mounted on terminal tag 4 within the hermetically sealed oscillator envelope by respective suspension wires 2 and 3. The suspension wires are connected to respective tines of the vibrator element.

Referring now to FIG. 2, a tuning fork-type vibrator element 5 is secured to finger 6 mounted on the oscillator terminal tag and extending upwardly therefrom and laterally thereacross. The envelope for the oscillator is hermetically sealed to the terminal tag. A pair of opposed coaxial notches 7 is provided in the base of vibrator 5 for thereby providing that respective mounted shoulders and the base of the vibrator secured to oscillator finger 6 are independent of vibrations which occur through the vibrating tines of crystal 5. In particular, the shoulders and base of the vibrator are secured to a planar face of finger 6 and vibrator element 5 is arranged substantially perpendicular to finger 6 thereon.

As hereinbefore set forth, the prior art oscillator embodiment shown in FIG. 1 is difficult to fabricate, bulky and delicate; while the prior art oscillator embodiment shown in FIG. 2 is incapable of withstanding severe external shock, and moreover, opposed coaxial notches 7 provided in crystal 5 are difficult to make.

Referring now to FIGS. 3–6, a tuning fork-type crystal vibrator 8, preferably of quartz, is mounted in hermetically sealed oscillator envelope 33 on a novel bifurcated mounting plate 11 having elastic characteristics and preferably fabricated of phosphorous bronze, beryllium copper, or spring steel. The suitable material may be stamped and press formed to the configuration shown particularly in FIG. 6.

Oscillator 53 comprises a substantially flat hermetically sealed envelope 33 including underlying-overlying annular sections 26 and 28 each provided with a continuous rim, respectively 27 and 29, along which sections 26, 28 are engaged for thereby forming a continuous exteriorly extending flange 52. Sealed sections 26, 28 provide a housing for the oscillator components and define a substantially annular interior cavity wherein the components are mounted. A terminal tag 21 provided with a contact pin 25 is fixedly mounted in envelope 33 in a support 34 therefor, comprising a substantially annular support member 35 provided with an annular rib 22 on the periphery thereof defined between opposed elbows 23, 24 therein. Elbow 23 defines a groove with perpendicular abutment surfaces 36, 37 which abut a continuous edge of an aperture 38 provided in envelope section 26 for oscillator terminal tag 21 and contact pin 25 mounted therein.

Elbow 24 provided in annular support 34 defines a groove having perpendicular abutment surfaces 39, 40 for thereby supporting bifurcated crystal mounting plate 11 which is provided at one end thereof with an annular aperture 18 received on annular support 34. Annular support member 35 is provided with an annular through hole in which terminal tag 21 is mounted.

Bifurcated mounting plate 11 is provided with a laterally extending substantially perpendicular flange 14 engaged with a continuous edge 41 of tuning fork-type crystal 8 seated thereon. Bifurcations 42, 43 in mounting plate 11 and tines 44, 45 extend unidirectionally and respective opposed bifurcations 42, 43 of mounting plate 11 are in predetermined spaced relationship with respective contiguously extending tines 44, 45 of crystal 8.

Ends of the respective tines 44, 45 of crystal 8 are provided with weights 9 and 9′ for a selected, predetermined crystal frequency. Mounted in oscillator envelope 33 in substantial alignment with the weighted tine ends of crystal 8 on respective envelope sections 26, 28 are a pair of opposed dampers 30, 31 which enhance the impact-resistance characteristics of the oscillator. Also mounted in the oscillator envelope 33 is a ground pin 32 for preventing a short circuit thereof.

Figure 5:
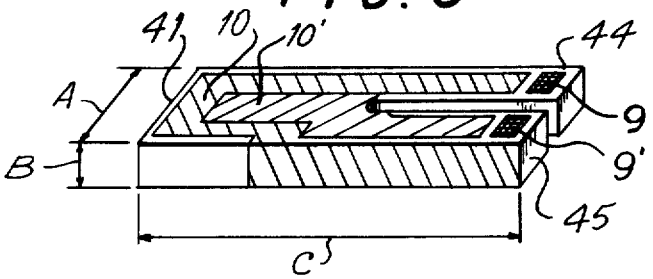
FIG. 5 is an exploded perspective view of the tuning fork-type vibrator mounted in the improved oscillator shown in FIGS. 3 and 4.

Referring particularly to FIG. 5, tuning fork-type vibrator 8 may be fabricated by suitably cutting a selectively dimensioned vibrator from a plate pellet. Preferable dimensions may be understood by reference to FIG. 5, wherein A is 1.35 mms, B is 0.5 mms, and C is 6.00 mms.

Chromium and gold are deposited on the cut crystal and the deposits thereof may be removed by suitably employing a laser beam which has a select, predetermined path. The laser path determines the configuration of a pair of contiguous electrodes 10 and 10′ formed on the crystal surface. It has been found that the use of a laser beam along a predetermined path for electrode formation is highly satisfactory for forming electrode configurations and improves the efficiency of the electrode forming process. Moreover, the electrodes may be formed on the crystal surface without deleterious effect on the vibrating characteristics of the crystal as compared with conventional methods for electrode formation whereby the electrodes are formed by peeling off deposited chromium and gold along a predetermined electrode configuration line. Additionally, according to conventional methods for electrode forming, corners of the crystal are either shaved or scraped to remove the deposited gold and chromium, or masked with a tape or nonconductive paint before deposition of the gold and chromium.

After deposition of the chromium and gold on the crystal surface, ends of tines 44, 45 are weighted by placing thereon weight members 9,9′ which may be of a suitable metallic or nonmetallic substance, such as, for instance, gold plating, wax, organic adhesive and the like. Weight members 9,9′ are placed on tines 44, 45 for the purpose of regulating the frequency of crystal 8. For example, a predetermined frequency value may be obtained by removing a small but effective amount of the substance from which weight members 9 and 9′ are fabricated, for instance, by a laser beam applied thereto after a coarse regulation of the crystal frequency and after the crystal is mounted in the oscillator. Therefore, by utilizing laser corrections, the accuracy of the oscillator as a time standard can be remarkably improved. Since laser corrections of the crystal frequency can be performed after the crystal is mounted, the crystal frequency can be accurately measured and suitably fine-tuned after the crystal is mounted on envelope section 26. The effect of weight members 9,9′ is most prominent when the dimension B of crystal 8 is 1.55 mms or less.

Figure 6:
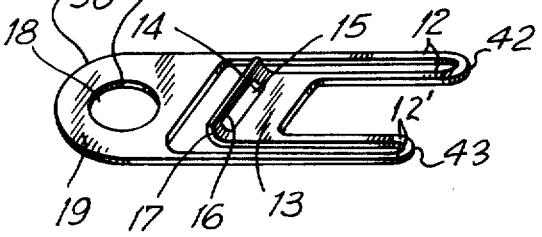
FIG. 6 is an exploded perspective view of the novel bifurcated mounting plate on which the tuning fork-type crystal vibrator shown in FIG. 5 is mounted in the improved oscillator of the instant invention, as shown in FIGS. 3 and 4.

Referring now to FIG. 6 which shows a bifurcated mounting plate 11 having elastic characteristics and which provides a mounting support for vibrator 8. Bifurcated mounting plate 11 may be suitably fabricated of phosphorous bronze, beryllium copper, spring steel, and like materials. A flat plate thereof may be press formed to the suitable configuration shown in FIG. 6. Mounting plate 11 has substantially a U-shape including a rounded shoulder 50 and bifurcations 42 and 43. Proximate rounded shoulder 50 thereof is an annulus 18 defined by a continuous perimeter 51 of plate 11. Aperture 18 is substantially circular and is registered with annular support member 35 whereby perimeter 53 engages the groove defined by elbow 24 for abutting surfaces 39, 40 and mounting plate 11 overlies rib 22 for thereby supporting bifurcated mounting plate 11 on support 34 such that bifurcated mounting plate 11 is substantially parallel to the end walls of envelope sections 26, 28 and a distance S from the end wall of envelope section 26.

Mounting plate 11 contain an interior configured slot running therethrough and interiorly through closed bifurcations 42 and 43 thereof.

Bifurcations 42 and 43, therefore, comprise continuous ribs 12 and 12′ provided with arcuate closed ends. Interior sections of rib members 12 and 12′ are integrally connected to a substantially flat plate member 13 on which crystal 8 is carried by plate 11. Crystal 8 may be fixedly mounted on flat plate member 13 of plate 11 by providing the underside gold-chromium plated surface thereof with a suitable wax or organic adhesive.

Integrally connected to the opposite end of flat plate member 13 is a flange 17 arranged substantially perpendicular thereto. Interiorly located within flange 17 is a slot 15 which eliminates a bent portion 14 in flange 17 for thereby assuring that substantially perpendicular portion 16 of flange 17 provides a backrest for continuous end 41 of crystal 8.

Figure 3:
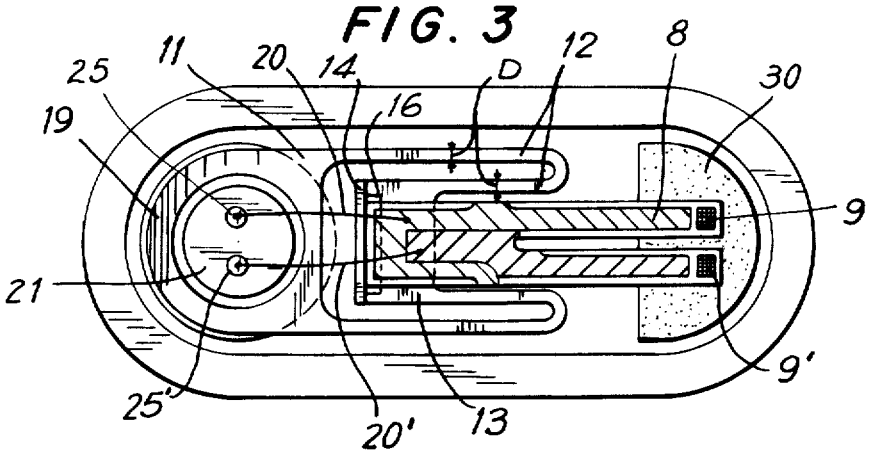
FIG. 3 is a top plan view of an improved oscillator constructed in accordance with the invention.
Figure 4:
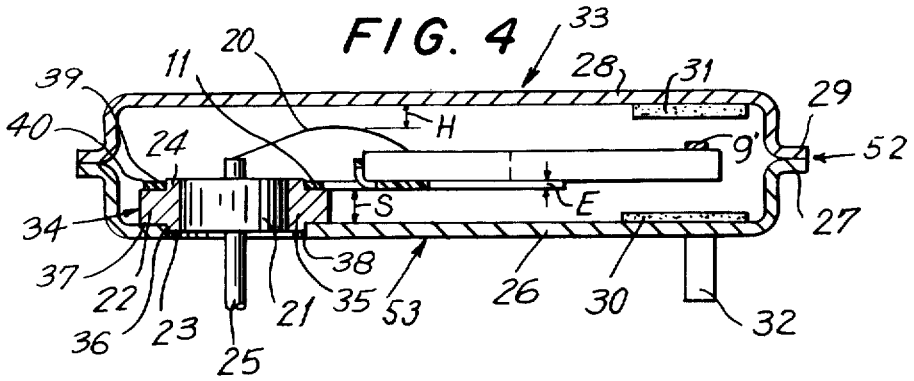
FIG. 4 is a sectional view of the improved oscillator shown in FIG. 3.

As best seen in FIGS. 3 and 4, continuous ribs 12 and 12' have resilient characteristics in the parallel and perpendicular directions relative to the vibrating direction of crystal 8. The spring constant of ribs 12 and 12' is preselected based upon the predetermined weight of the crystal to provide that the vibrating crystal 8 and envelope therefor are effectively independent of vibrations impacted thereagainst. When crystal 8 is dimensioned as hereinbefore set forth, then the width D of sections of ribs 12 and 12' is preferably 0.2 mms and the height thereof as shown by dimension E is preferably 0.15 mms.

When crystal 8 and bifurcated mounting plate 11 therefor are dimensioned as hereinbefore set forth, crystal 8 is not deleteriously affected by impacts to oscillator 53 and the vibrating Q value thereof remains substantially at an optimum value. The impact-resistance and high Q value of the vibrating crystal are attributable to the design of ribs 12 and 12' wherein ribs 12 and 12' are resilient both in parallel and perpendicular directions relative to the vibrating direction of crystal 8. To render the oscillator even more impact-resistant, dampers 30 and 31 of silicon or like material may be provided on the interior surfaces of envelope sections 26 and 28 in alignment with weighted ends of tines 44, 45 of crystal 8.

In the sequence of fabrication, crystal 8 may be secured to plate 11 by application thereto of an organic adhesive or wax. Plate 11 with crystal 8 mounted thereon is mounted on support 34 by registration of aperture 18 therein. As best seen in FIG. 3, fine lead wires 20 and 20' respectively connect electrodes 10 and 10'' of crystal 8 with respective contacts 25 and 25'. After the frequency of crystal 8 is optimally regulated, as hereinbefore set forth, envelope sections 26 and 28 are welded along respective engaged rim portions thereof 27 and 29 to form a single oscillator flange. The oscillator constructed in accordance with the invention may be secured to a timepiece by a suitable registration of contacts 25 and 25' and ground pin 32 in appropriate socket apertures provided therefor.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. An improved oscillator for a timepiece comprising a hermetically sealed oscillator envelope for housing oscillator components therein, a terminal tag mounted in said envelope being carried by a support therefor, contacts fixedly mounted in said terminal tag and extending exteriorly of said envelope housing, a tuning fork-type crystal vibrator mounted in said envelope, and a mounting means therefor carried on said terminal tag support, said means including bifurcations characterized by resilience in the vibrating direction of said crystal and perpendicularly thereto, said terminal tag support comprising a substantially annular support member, an annular rib on the periphery thereof, and a pair of opposed elbows therein, one of said elbows defining a groove having perpendicular abutment surfaces for abutting a continuous edge of an aperture provided in said oscillator envelope and said other elbow defining a groove having perpendicular abutment surfaces for thereby supporting said mounting means, said annular support member having a through hole in which said terminal tag is mounted.

2. The improved oscillator as claimed in claim 1, including a weight member overlying each time of said crystal and proximate the end thereof, each of said weight members being fractionally removable for selectively tuning respective tines of said crystal to a predetermined, selected frequency, said weight members being coplanar and constituted of gold plating, wax, or organic adhesive.

3. The improved oscillator as claimed in claim 2, including a pair of opposed dampers provided on the interior surfaces of respective sections of said hermetically sealed envelope, said dampers being substantially aligned and in substantial alignment with said weight members overlying respective tines of said crystal.

4. The improved oscillator as claimed in claim 2, including a ground pin mounted in said envelope and extending exteriorly thereof, said ground pin being arranged substantially in parallel with said contacts.

5. The improved oscillator as claimed in claim 1 wherein said hermetically sealed oscillator envelope includes an underlying and an overlying annular section, each of said sections having a continuous rim along which said sections are engaged for thereby forming a continuous exteriorly extending envelope flange, said engaged sections providing a housing for oscillator components and defining a substantially annular interior cavity wherein components are mounted.

6. The improved oscillator as claimed in claim 1, wherein said mounting means has elastic characteristics and a thickness of up to 0.5 mms.

7. The improved oscillator as claimed in claim 6 wherein said crystal vibrator mounted on said mounting means has a thickness of up to 1.5 mms.

8. The improved oscillator as claimed in claim 1, said mounting means comprising a substantially planar plate having a U configuration including a rounded shoulder and a pair of substantially parallel bifurcations, said rounded shoulder having an annulus defined therein by a continuous perimeter of said plate, said annulus being registrable with said annular support member whereby said plate perimeter engages said groove defined by said other elbow for abutting said perpendicular surfaces defined thereby and said plate member overlying said rib of said support for thereby supporting said bifurcated plate on said support, said bifurcated plate being arranged substantially parallel to end walls of said oscillator envelope and a predetermined distance form one of said end walls.

9. The improved oscillator as claimed in claim 8, said mounting means further including an interior configured on slot running therethrough and interiorly through arcuate closed bifurcations thereof, said bifurcations thereby comprising a pair of parallel arcuate continuous ribs provided with arcuate closed ends, said ribs having respective interior sections thereof integrally connected to a substantially flat plate member on which said crystal is carried by said plate.

10. The improved oscillator as claimed in claim 9, said substantially flat plate member including an integrally connected flange substantially perpendicular thereto, said flange having an interiorly located slot for thereby eliminating a bent portion thereof for thereby assuring that its perpendicular section provides a backrest for a continuous end of said crystal.

*11. A hermetically sealed quartz crystal tuning fork vibrator assembly particularly for use as a time standard in an oscillator circuit comprising in combination a flexural mode tuning fork quartz crystal vibrator having two substantially opposed planar surfaces and being adapted to vibrate in a first vibratory direction substantially parallel to said surfaces, and a mounting plate having a first portion including a substantially flat surface, the flat surface being secured to one of said opposed surfaces at a non-vibratory portion of said tuning fork vibrator, said mounting plate including a second portion mounted to a reference member, said mounting plate having a resilient portion intermediate said first and second portions, said resilient portion being formed of two substantially U-shaped spring-like elements, a first leg of each element being connected to said second portion and the other leg of each U-shaped spring-like element being adapted to vibrate in said first vibratory direction and to further vibrate in a second vibratory direction at an angle of about 90° with respect to said first vibratory direction.*

*12. A hermetically sealed quartz crystal vibrator assembly as claimed in claim 11, wherein said reference member includes a hermetical terminal having leads and said assembly includes means for electrically coupling said hermetically terminal leads to said vibrator, said hermetical terminal being further formed with an annular projection, said second portion of said mounting plate being shaped as a collar and adapted to be secured around said annular projection, said first leg of each said U-shaped spring elements being connected to substantially diametrically opposite ends of said collar portion.*

* * * * *